United States Patent [19]

Thakur et al.

[11] Patent Number: 5,445,999
[45] Date of Patent: Aug. 29, 1995

[54] ADVANCED TECHNIQUE TO IMPROVE THE BONDING ARRANGEMENT ON SILICON SURFACES TO PROMOTE UNIFORM NITRIDATION

[75] Inventors: Randhir P. S. Thakur; Viju K. Mathews, both of Boise, Id.

[73] Assignee: Micron Technology, Inc., Boise, Id.

[21] Appl. No.: 975,767

[22] Filed: Nov. 13, 1992

[51] Int. Cl.$^6$ ............................................. H01L 21/465
[52] U.S. Cl. .................................... 437/242; 437/246; 437/241; 148/DIG. 17
[58] Field of Search ................ 437/246, 241, 242, 920; 427/61, 572; 148/DIG. 17

[56] References Cited

U.S. PATENT DOCUMENTS

| | | | |
|---|---|---|---|
| 4,702,936 | 11/1987 | Maeda et al. | 437/241 |
| 4,778,692 | 11/1988 | Ishihara et al. | 437/241 |
| 4,949,154 | 8/1990 | Haken | 357/54 |
| 5,094,966 | 3/1992 | Yamazaki et al. | 437/241 |

OTHER PUBLICATIONS

G. W. Yoon, et al. "Effects of Surface Pretreatment on Polysilicon Electrode Prior to Si$_3$N$_4$ Depositon" IEEE Trans. on Electron Dev. 41 (3) (Mar. 1994) pp. 347–351.
N. Ajika, et al. "Enhanced Reliability of Native Oxide Free Capacitor Dielectrics on RTN Polysilicon" Symp. VLSI Tech. Dig. (1991) (month unknown) pp. 63–64.
Ito et al., "Thermal Nitridatioin of Silicon in Advanced LSI Processing", Japanese Journal of Applied Physics, vol. 20 (1981) Supplement 20-1, pp. 33–34.
Nakano et al., "A Native-Oxide-Free Process for 4nm Capacitor Dielectrics", 1992 Symposium on VLSI Technology Digest of Technical Papers, pp. 16–17.
Kaxiras, "Effect of Surface Reconstruction on Stability and Reactivity of Si Clusters", Physical Review Letters, vol. 64, No. 5, Jan. 1990, pp. 551–554.
Rosato et al., "Ultra–High Capacitance Nitride Films Utilizing Surface Passivation on Rugged Polysilicon", IEEE International Electron Devices, 1991, pp. 1—3.

Nulman et al., "Electrical and Structural Characteristics of Thin Nitrided Gate Oxides Prepared by Rapid Thermal Nitridation", 1984, IEDM, pp. 169–170.
Ourmazd et al., "Effect of Processing on the Structure of the Si/SiO$_2$ Interface", American Institute of Physics, Aug. 1988, p. 743.
Joshi et al., "Performance and Reliability of Ultrathin Resistive Nitrided Oxides Fabricated by RTP", SPIE, vol. 1393, Rapid Thermal and Related Processing Techniques, 1990, pp. 128–129.

(List continued on next page.)

*Primary Examiner*—Olik Chaudhuri
*Assistant Examiner*—C. Everhart
*Attorney, Agent, or Firm*—Lia M. Pappas

[57] ABSTRACT

The present invention teaches a method for fabricating an ultrathin uniform dielectric layer over a silicon or polysilicon semiconductor substrate. The method entails first providing a substrate having a conductive area into a chamber. Subsequently, the first conductive material is destabilized by introducing it to reactive gas and radiant energy in situ. The reactive gas can be Ar-H$_2$, H$_2$, GeH$_4$ or NF$_3$ gas. The radiant energy source can be ultraviolet ("UV") or Tungsten Halogen lamps preferably having an approximate range of 0.2 to 1.6 μm to provide heat of approximately 850° to 1150° C. for approximately 10 to 60 seconds at a vacuum pressure range of 10$^{-10}$ Torr to atmospheric pressure. This process removes the native oxide and breaks the molecular clusters present on the silicon or polysilicon surface. Thereafter, a first dielectric layer having a substantially uniform thickness forms directly above the substrate by the in situ introduction of NH$_3$ with the radiant energy generating heat of approximately 850° to 1150° C. for approximately 10 to 60 seconds at a vacuum pressure range of 10$^{-10}$ Torr to atmospheric pressure. Finally, a second silicon nitride layer is deposited by low pressure chemical vapor deposition or plasma nitridation to create a combined thickness of both dielectric layers of 40 to 100 Å.

18 Claims, 6 Drawing Sheets

OTHER PUBLICATIONS

Rosato, Fazan, Mathews Hawthorne, Dryer, Eyolfson, Ditali, and Chan, Ultra-High Capacitance Nitride Films Utilizing Surface Passivation on Rugged Polysilicon, Device Technology session to 1991 IEEE International Electron Devices Metting, pp. 1-3.

Nulman and Krusius, Rapid thermal nitridation of thin thermal silicon dioxide films, Appl. Phys. Lett., vol. 47, No. 2, Jul. 15, 1985, pp. 148-150.

J. Cable, High-Field Mobility Effects in Reoxidized Nitrided Oxide (ONO) Transistors, IEEE Transactions, vol. 39, No. 3, Mar. 1992, pp. 607-613.

Jodhi and Kwong, Influence of process parameters on the time-dependent dielectric breakdown of rapid thermally nitrided and reoxidized thin $SiO_2$, J. Appl. Phys. Lett. 60 (12) Mar. 23, 1992, pp. 1489-1491.

Moslehi, Fu, Sigmon, Saraswat, Low-temperature direct nitridation of silicon in nitorgen plasma generated by microwave discharge, J. Appl. Phys. 58(6), Sep. 15, 1985, pp. 2416-2419.

K. Ando, et al. "Ultrathin Silicon Nitride films by RTP and CVD" Appl. Phys. Lett. 26 Aug. 1991 pp. 1081-1083.

(KNOWN ART)

(KNOWN ART)

(KNOWN ART)

(KNOWN ART)

ADVANCED TECHNIQUE TO IMPROVE THE BONDING ARRANGEMENT ON SILICON SURFACES TO PROMOTE UNIFORM NITRIDATION

FIELD OF THE INVENTION

This invention relates to VLSI semiconductor CMOS processes and to a method for fabricating a cell capacitor over a semiconductive substrate. More particularly, the invention relates to a process for formulating a thin dielectric layer by promoting uniform nitridation. The invention is particularly applicable to Dynamic Random Access Memory ("DRAM") devices.

BACKGROUND OF THE INVENTION

The continuing trend of scaling down integrated circuits has forced the semiconductor industry to consider new techniques for fabricating precise components at submicron levels. This is of particular relevance to the manufacture of DRAM devices. Dielectric layers are the foundation to the creation of cell capacitors. The expansion of the memory capacity of a DRAM device is dependent on the ability to fabricate smaller cells having increased capacitances. As such, the thinner a dielectric layer can be manufactured having an equivalent or increased dielectric constant, the smaller the cell.

In metal oxide semiconductor ("MOS") technology, small, high performance transistors require thin gate and cell dielectrics. An ultrathin ($\leq 100$ Å) dielectric layer should minimally comprise enhanced dielectric properties. However, several additional design considerations must be examined in the manufacture of ultrathin dielectric layers. These include uniformity in thickness, reliability, high dielectric constant, as well as imperviousness to thermal breakdown. Ultimately, high performance, ultrathin dielectric layers should also comprise a low diffusion rate for impurities, low interface state density, and be chemically stable. Nevertheless, the physical constraints of the materials and methods of fabrication employed have made the characteristics of the dielectrics derived less than the optimum.

Silicon dioxide, at thicknesses greater than 100 Å, provides a cost effective, high quality dielectric layer for single crystal silicon or polycrystalline silicon ("polysilicon") substrates. Nonetheless, for dielectric layers less than 100 Å, silicon dioxide is known to have a high defect density and a low efficacy as a diffusion mask against impurity diffusion.

In light of silicon dioxide's inherent limitations for dielectric layers of 100 Å or less, several alternatives have been developed. One such alternative is the use of silicon nitride ($Si_3N_4$) as a dielectric layer. This layer can be formed on a substrate's surface through a process which includes Rapid Thermal Nitridation ("RTN"). Under RTN, the silicon substrate is exposed to either pure ammonia ($NH_3$) or an ammonia plasma at temperatures approximately between 850° and 1200° C. to form a silicon nitride film.

Precise ultrathin dielectric layers are currently fabricated employing RTN. However, the dielectric layers formed thereby have had several shortcomings. These ultrathin dielectrics have lacked uniformity in their overall composition. Further, they have had questionable reliability in part because of their susceptibility to thermal breakdown. Hence, the overall cell capacitance of the known art is limited.

For example, in U.S. Pat. No. 4,949,154, inventor Haken teaches a method of depositing a thin dielectric over a polysilicon substrate. Applying the technique of Haken, a silicon nitride layer is formed over a silicon dioxide layer, which is positioned over the polysilicon substrate. Subsequently, transistors are formed in the cleared areas of the polysilicon substrate, and a second layer of field oxide is grown. This approach creates O-N-O thin dielectric layers atop the polysilicon substrate. It is this additional oxide layer which reduces the uniformity and reliability of the overall dielectric layer.

SUMMARY OF THE INVENTION

The primary object of the present invention is to eliminate the aforementioned drawbacks of the prior art. Another object of the present invention is to provide a method of fabricating an ultrathin dielectric layer over a rugged and/or smooth, polysilicon or silicon substrate that has improved uniformity. A further object of the present invention is to provide a method of fabricating an ultrathin dielectric layer having an increased capacitance. Still another object of the present invention is to provide a method of fabricating an ultrathin dielectric layer having an increased time dependent dielectric breakdown and improved reliability. It is a further object of the present invention to provide a method of fabricating an ultrathin dielectric layer having an increased dielectric constant.

In order to achieve these hereinabove objects, as well as others which will become apparent hereafter, a method for fabricating semiconductor wafers is disclosed wherein a rugged and/or smooth, silicon or polysilicon substrate having a first conductive material is first provided into a chamber. Subsequently, the first conductive material is destabilized by introducing it to reactive gas and radiant energy in situ. The reactive gas can be $Ar-H_2$, $H_2$, $GeH_4$ or $NF_3$ gas. The radiant energy source can be ultraviolet ("UV") or Tungsten Halogen lamps preferably having an approximate range of 0.2 to 1.6 $\mu$m to provide heat of approximately 850° to 1150° C. for approximately 10 to 60 seconds at a vacuum pressure range of $10^{-10}$ Torr to atmospheric pressure. Thereafter, a first dielectric layer having a substantially uniform thickness forms directly above the substrate by the in situ introduction of $NH_3$ with the radiant energy generating heat of approximately 850° to 1150° C. for approximately 10 to 60 seconds at a vacuum pressure range of $10^{-10}$ Torr to atmospheric pressure. Finally, a second silicon nitride layer is deposited in situ by low pressure chemical vapor deposition or plasma nitridation to create a combined thickness of both dielectric layers of 40 to 100 Å.

BRIEF DESCRIPTION OF THE DRAWINGS

The present invention will be better understood from reading the following description of non-limitative embodiments, with reference to the attached drawings, wherein below.

DETAILED DESCRIPTION OF THE INVENTION

Figure 1A:
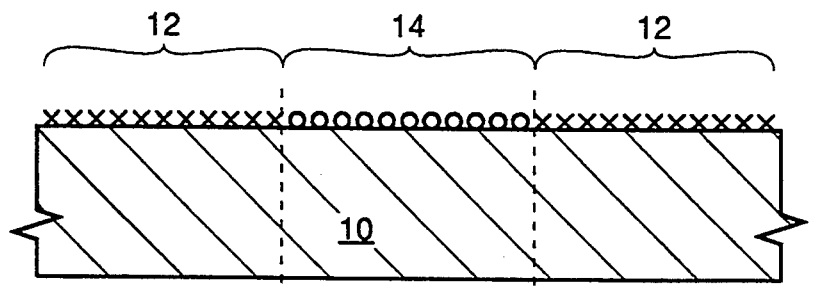
FIGS. 1(a)–1(c) is a cross-sectional view of a silicon substrate undergoing the steps of the known art for fabricating a thin nitride dielectric layer.
Figure 1B:
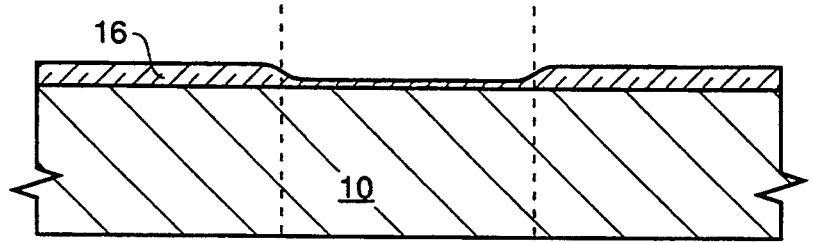
Figure 1C:
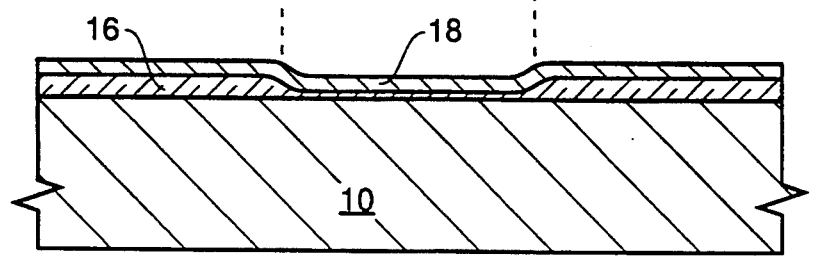

Referring to FIGS. 1(a)–1(c), the prior art method of fabricating a dielectric layer superjacent a substrate employing the known art is illustrated. In FIG. 1(a), substrate 10, comprised of silicon or polysilicon, within a chamber is depicted. At this point in the known process, substrate 10 comprises molecular clusters 14 and dangling bonds 12 on its outer surface because of its crystallized nature.

Subsequently, a native silicon oxide layer 16 forms directly on substrate 10, as shown in FIG. 1(b). The growth and configuration of native oxide 16 directly correlates to dangling bonds 12 and silicon molecular clusters 14. The regions where silicon molecular clusters 14 exist, a thin layer native oxide will form. In contrast, a thicker layer of native oxide will develop in regions of the substrate where dangling bonds 12 reside. This distinction is in part because molecular clusters 14 are not as reactive as dangling bonds 12.

After the native oxide 16 is formed, RTN is performed on substrate 10 with its native oxide 16. As illustrated in FIG. 1(c), the result of this process is that a silicon nitride layer 18 develops superjacent native oxide 16. In light of the dangling bonds and silicon molecular clusters and their distinct reactivity, silicon nitride layer 18 does not comprise a uniform thickness. As a thicker layer of native oxide 16 forms over the regions of dangling bonds 12, so does silicon nitride layer 18. Thus, the resultant dielectric layer fails to reach a uniform thickness.

Figure 2A:
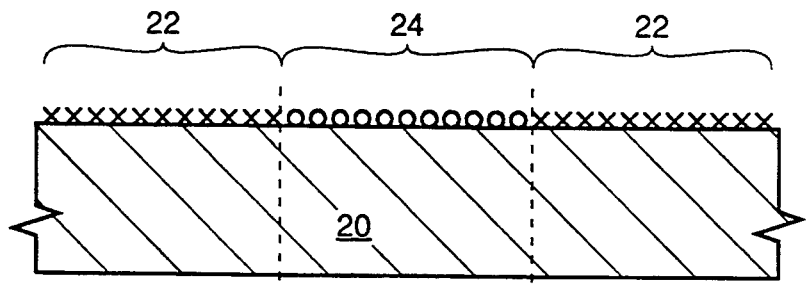
FIGS. 2(a)–2(c) is a cross-sectional view of a silicon substrate undergoing the steps of the proposed process for fabricating a thin nitride dielectric layer.
Figure 2B:
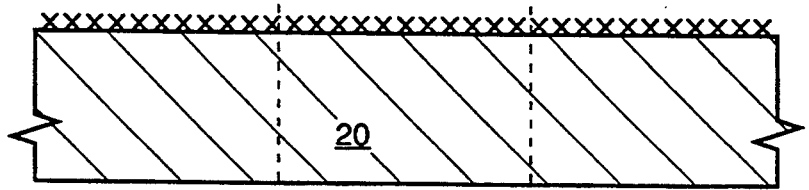
Figure 2C:
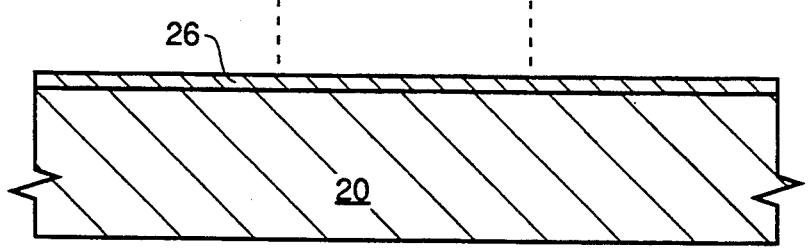

Referring to FIGS. 2(a)–2(c), an advanced method for improving the bonding arrangement on silicon surfaces to promote uniform nitridation is illustrated. In FIG. 2(a), step one of the invention is depicted where a substrate 20 is introduced into a chamber (not shown). Substrate 20 comprises silicon or polysilicon, and by its very nature, has a conductive path. The silicon or polysilicon can be rugged and/or smooth. Further, substrate 20 comprises dangling bonds 22 and molecular clusters 24 on its outer surface.

As shown in FIG. 2(b), the second step of the invention involves destabilizing the outer surface of substrate 20 to provide a uniform dangling bond configuration 26. The destabilizing process of the outer surface of substrate 20 is accomplished by performing Rapid Thermal Processing ("RTP") on substrate 20.

RTP is a method of heating a substrate through the use of radiation. This approach provides several advantages over other heating techniques. First, RTP allows the surface of the substrate to reach the required process temperature much quicker; in a matter of seconds. Furthermore, RTP enables the substrate's surface to cool in a matter of seconds. In light of its quick heating and cooling characteristics, RTP protects the body of the substrate from reaching the process temperature. As such, RTP provides accurate control of the development of thin oxide films because of the short heating/cooling time cycle.

The process step of destabilizing, relying on RTP principles, involves exposing the outer surface of substrate 20 to reactive gas and radiant energy in situ at a vacuum pressure range of $10^{-10}$ Torr to atmospheric pressure. Ar-$H_2$ is a preferred reactive gas because the hydrogen (H) component increases the instability of substrate 20 at lower temperatures, while the argon (Ar) component provides inert ambient characteristics. Nonetheless, $H_2$, $GeH_4$ or $NF_3$ diluted with Ar-$H_2$ can also be used.

With respect to the radiant energy, a source should preferably provide energy in the absorption band of silicon in order to properly destabilize substrate 20. In the preferred embodiment of the invention, UV lamps are employed to supply photon energy with a wavelength in the approximate range 0.2 to 1.6 $\mu$m. However, fast heating RTP lamps, such as Tungsten Halogen types, also can be used.

As radiant energy in the presence of reactive gas is introduced to substrate 20, the silicon molecular clusters along with the already present dangling bonds are converted to form a uniform dangling bond configuration 26. To this end, the radiant energy applied through this RTP step must be in the range of 850° to 1150° C. and continue for approximately 10 to 60 seconds.

As shown in FIG. 2(c), the third step of the invention involves RTN. Applying RTN principles, the outer surface of substrate 20 is exposed to $NH_3$ and radiant energy in situ at a vacuum pressure range of $10^{-10}$ Torr to atmospheric pressure in situ. The source of the radiant energy to simplify the overall process should be the same as for the process step of destabilization. The energy source should heat the outer surface of substrate 20 to a temperature range of approximately 850° to 1150° C. for approximately 10 to 60 seconds. In light of the reactivity of the uniform dangling bond configuration 26, a silicon nitride layer 28 having a uniform thickness forms superjacent substrate 20. The thickness of silicon nitride layer 28 ranges from approximately 15 to 40 Å.

Figure 3:
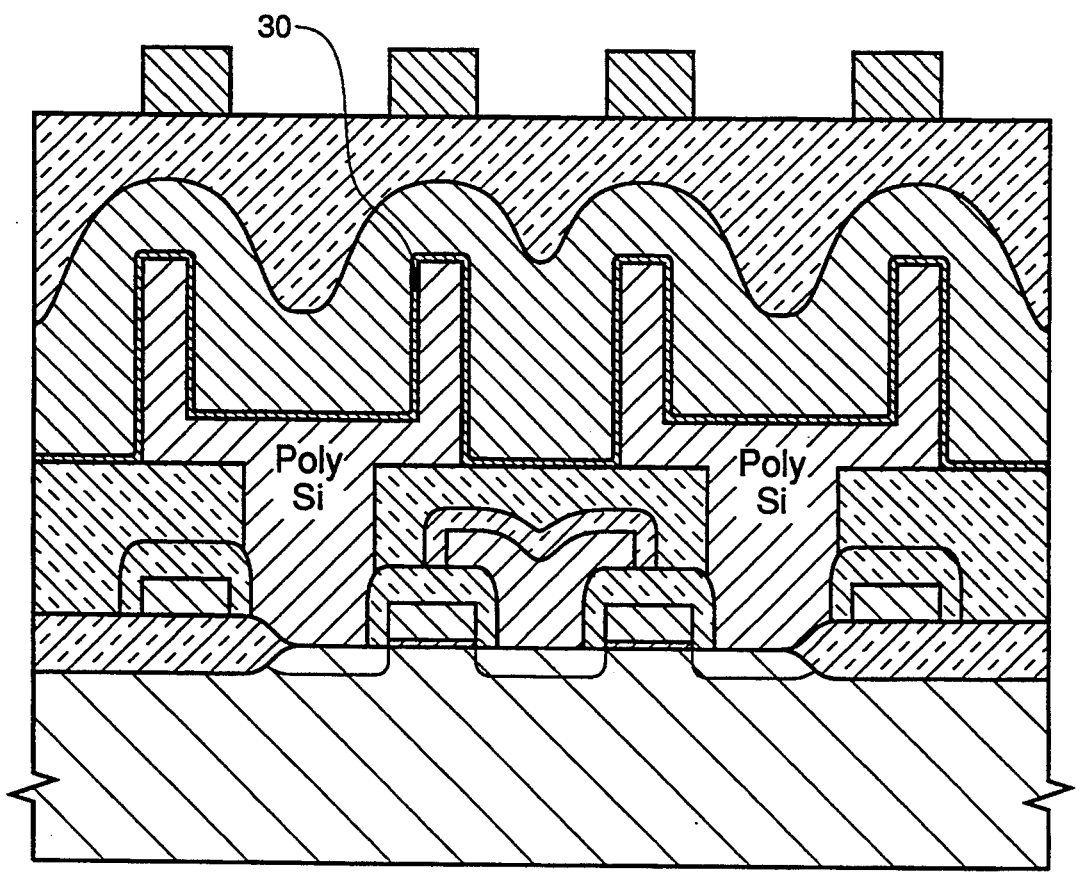
FIG. 3 is a cross-sectional view of the cell capacitor structure of a DRAM device.

To further enhance the overall dielectric properties, an alternative embodiment of the present invention includes depositing an additional silicon nitride layer (not shown) in situ. In certain applications, such as the cell capacitance structure in DRAM device illustrated in FIG. 3, the dielectric layer 30 must have a specified thickness. Thus, to enhance the overall dielectric integrity, an additional silicon nitride layer is deposited superjacent silicon nitride layer 28. This deposition step can be accomplished by low pressure chemical vapor deposition, as well as plasma nitridation techniques. The overall result yields a dielectric layer of silicon nitride on the order of approximately 40 to 100 Å.

In another alternative embodiment, subsequent to forming a dielectric layer of silicon nitride having a thickness of approximately 40 to 100 Å, a layer of silicon dioxide (not shown) can be formed in situ superjacent to further reduce leakage within the dielectric. Unlike the prior art approach, the present invention presents a dielectric layer having a substantially uniform thickness comprised of silicon nitride including an silicon dioxide layer superjacent, as opposed to subjacent, to the silicon nitride layer.

Figure 4:
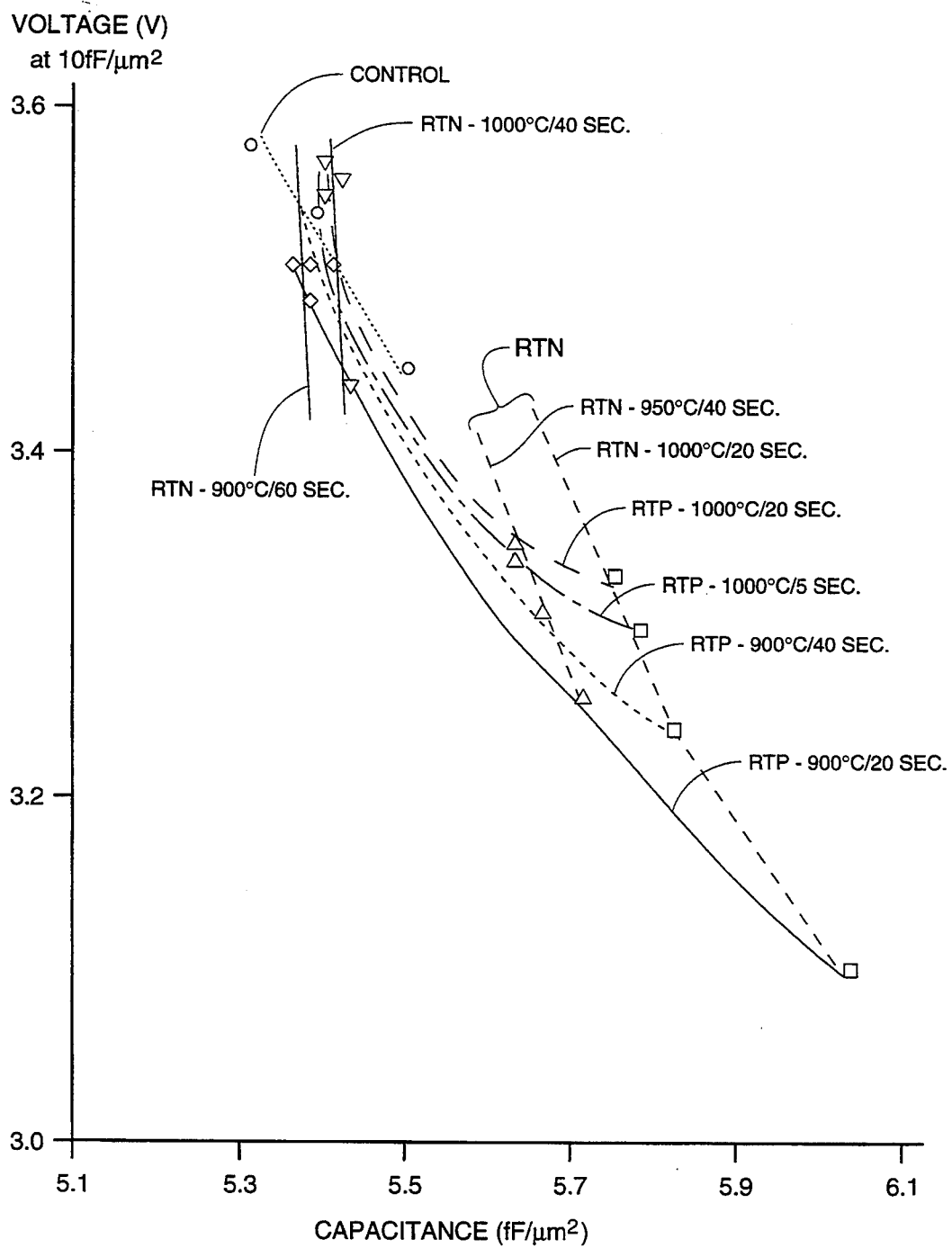
FIG. 4 is a graph depicting the effect of in situ cleaning involving Rapid Thermal Processing on dielectric characteristics.
Figure 5:
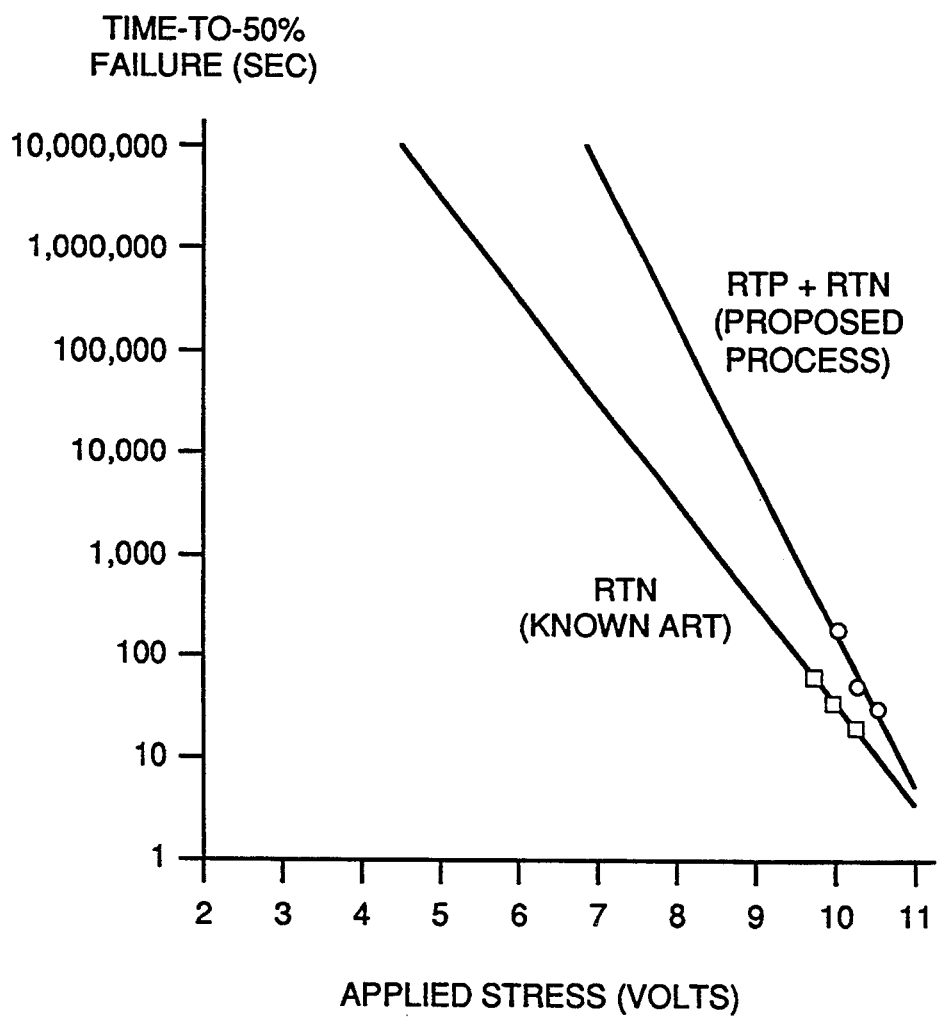
FIG. 5 is a graph comparing the Voltage versus Time Dependent Dielectric Breakdown characteristics of the known art and the proposed process.

By applying the hereinabove invention, a cell capacitor having improved dielectric characteristics can be fabricated, as shown in FIG. 4. FIG. 4 illustrates the effects of in situ cleaning involving RTP on dielectric characteristics. The hereinabove invention also provides enhanced time dependent dielectric breakdown properties, as shown in FIG. 5.

Figure 6:
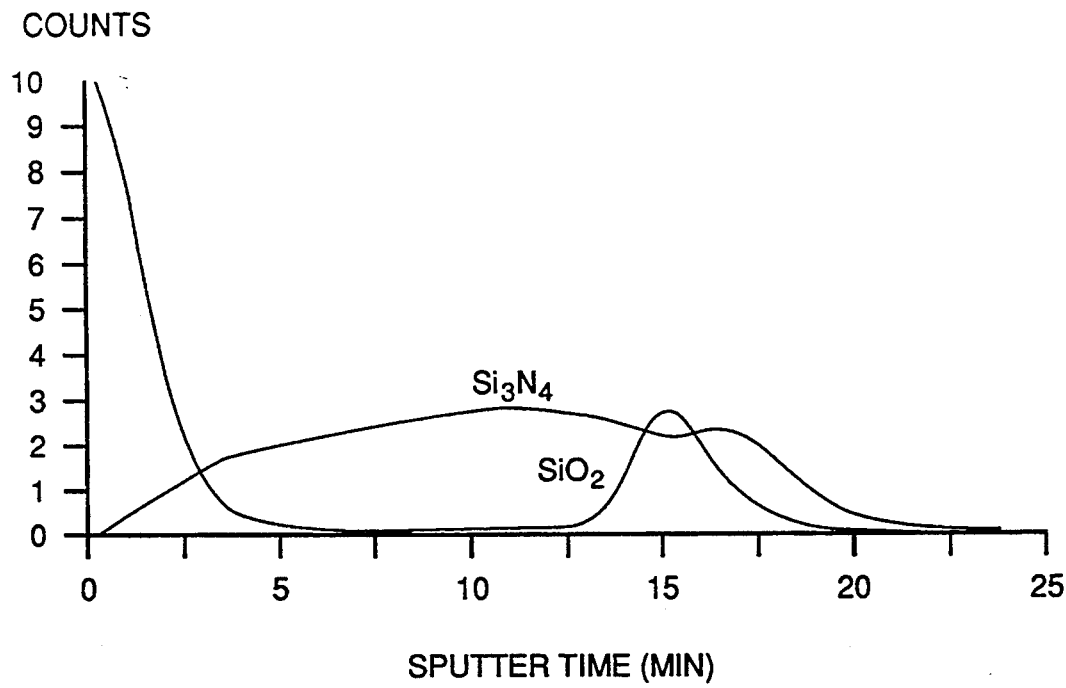
FIG. 6 is a depth graph of a dielectric fabricated according to the known art.
Figure 7:
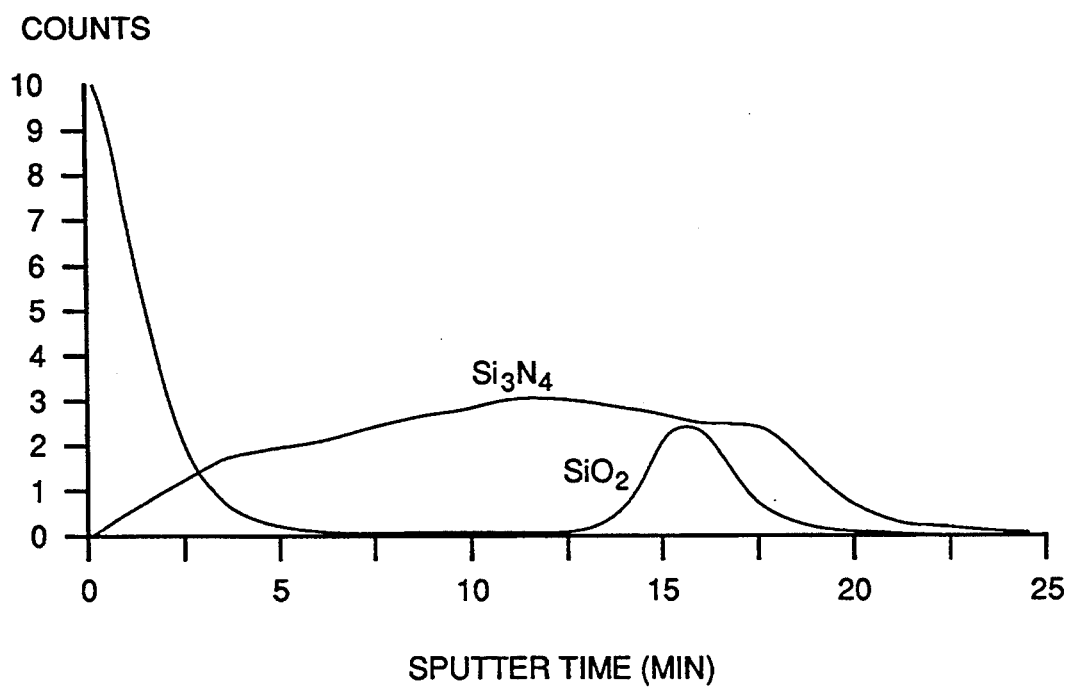
FIG. 7, a depth graph of a dielectric fabricated according to proposed invention.

Referring to FIGS. 6 and 7, a depth analysis comparison of a dielectric fabricated according to the known art with the proposed hereinabove invention is provided. In the proposed invention, the levels of silicon dioxide reach a reduced value of that of silicon nitride, as shown in FIG. 7.

While the particular process as herein shown and disclosed in detail is fully capable of obtaining their objects and advantages herein before stated, it is to be understood that it is merely illustrative of the presently preferred embodiments of the invention and that no limitations are intended to the details of construction or design herein shown other than as described in the appended claims.

We claim:

1. A rapid thermal nitridation (RTN) method for fabricating uniform, thin nitride films, comprising the steps of:
    a) providing a silicon substrate comprising a polysilicon material in a rapid thermal processing chamber, said polysilicon material having molecular clusters and dangling bonds;
    b) forming a uniform dangling bond configuration by introducing reactive gas at a high temperature, said high temperature being in the approximate range of 850° C. and 1150° C., said reactive gas comprises at least one of $Ar-H_2$, $H_2$, $GeH_4$, and $NF_3$ diluted with $Ar-H_2$; and
    c) growing a first substantially uniform, thin nitride layer superjacent said polysilicon material by introducing $NH_3$ while rapidly heating said silicon substrate in situ.

2. A method according to claim 1, further comprising the step of:
    d) depositing a second substantially uniform, thin nitride layer superjacent said first substantially uniform, thin nitride layer thereby forming a composite nitride layer having an overall thickness.

3. A method according to claim 2, further comprising the step of:
    e) positioning a second polysilicon material superjacent said second substantially uniform, thin nitride layer to form a capacitor.

4. A method according to claim 2, further comprising the step of:
    e) growing a silicon dioxide layer superjacent said second substantially uniform, thin nitride layer to reduce leakage within said composite nitride layer.

5. A method according to claim 2, wherein said depositing comprises low pressure chemical vapor deposition.

6. A method according to claim 2, wherein said depositing comprises plasma nitridation.

7. A method according to claim 1, wherein said chamber is pressurized at a substantially low vacuum pressure.

8. A method according to claim 7, wherein said substantially low vacuum pressure is in the approximate range of $10^{-10}$ Torr to atmospheric pressure.

9. A method according to claim 1, wherein said high temperature is generated by radiant energy having a wavelength in the approximate range 0.2 to 1.6 $\mu$m.

10. A method according to claim 9, wherein said radiant energy comprises photon energy in the absorption band of silicon.

11. A method according to claim 1, wherein said high temperature is generated by means of a Tungsten Halogen lamp.

12. A method according to claim 1, wherein said high temperature is generated by means of a UV lamp.

13. A method according to claim 1, wherein said silicon substrate is in either single-crystal or polycrystalline form.

14. A method according to claim 1, wherein said radiant energy is applied for approximately 10 to 60 seconds at a vacuum pressure range of $10^{-10}$ Torr to atmospheric pressure.

15. A method according to claim 1, wherein said first uniform, thin nitride layer has a thickness in the approximate range of 15 to 40 Å.

16. A method according to claim 2, wherein said overall thickness of said composite nitride layer is in the approximate range of 40 to 100 Å.

17. A rapid thermal processing method for fabricating thin film dielectrics, comprising the steps of:
    a) providing a substrate having a conductive material within chamber, said substrate comprising silicon material, said first conductive material comprising molecular clusters and dangling bonds;
    b) destabilizing said molecular clusters to form a uniform dangling bond configuration by introducing in situ reactive gas at a temperature greater than 1000° C. continuously for approximately 10 to 60 seconds, at a vacuum pressure in the range of $10^{-10}$ Torr to atmospheric pressure, said reactive gas comprises at least one of $Ar-H_2$, $H_2$, $GeH_4$, and $NF_3$ diluted with $Ar-H_2$, thereby providing said conductive material with a uniform dangling bond configuration;
    c) growing a first thin dielectric layer having a thickness of less than 30 Å superjacent said conductive material by introducing in situ $NH_3$ at a temperature greater than 1000° C. continuously for approximately 10 to 60 seconds, at a vacuum pressure range of $10^{-10}$ Torr to atmospheric pressure;
    d) depositing a second thin dielectric layer dielectric superjacent said first thin dielectric layer, thereby forming a composite dielectric layer having an overall thickness in the range of approximately 40 to 100 Å; and
    e) re-oxidizing said composite dielectric layer, thereby forming a silicon dioxide layer superjacent said second thin dielectric layer, thereby reducing leakage within said composite dielectric layer.

18. A method for fabricating thin film capacitors, comprising the steps of:
    a) providing a semiconductor substrate having polysilicon within chamber polysilicon comprising molecular clusters and dangling bonds;
    b) precleaning said substrate by introducing in situ reactive gas and radiant energy, in the range of 850° to 1150° C. continuously for approximately 10 to 60 seconds, at a vacuum pressure in the range of at least $10^{-10}$ Torr to atmospheric pressure, said reactive gas comprises at least one of $Ar-H_2$, $H_2$, $GeH_4$, and $NF_3$ diluted with $Ar-H_2$, thereby providing said polysilicon with a uniform configuration;
    c) growing a first silicon nitride layer having a thickness in the range of approximately 15 to 40 Å superjacent said polysilicon by introducing in situ $NH_3$ and radiant energy, in the range of 850° to 1150° C. continuously for approximately 10 to 60 seconds, at a vacuum pressure range of $10^{-10}$ Torr to atmospheric pressure;

d) depositing a second silicon nitride layer superjacent said first silicon nitride layer, thereby forming a composite uniform silicon nitride layer having a overall thickness in the range of approximately 40 to 100 Å; and e) growing a silicon dioxide layer superjacent said second nitride layer, thereby reducing leakage within said composite uniform silicon nitride layer.

* * * * *